(12) United States Patent
Salinas et al.

(10) Patent No.: US 9,857,027 B2
(45) Date of Patent: Jan. 2, 2018

(54) APPARATUS AND METHOD FOR SELF-REGULATING FLUID CHEMICAL DELIVERY

(71) Applicant: APPLIED MATERIALS, INC., Santa Clara, CA (US)

(72) Inventors: Martin Jeff Salinas, Campbell, CA (US); Youqun Dong, Santa Clara, CA (US); David Thompson, San Jose, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 135 days.

(21) Appl. No.: 14/476,215

(22) Filed: Sep. 3, 2014

(65) Prior Publication Data

US 2016/0004259 A1    Jan. 7, 2016

Related U.S. Application Data

(60) Provisional application No. 62/020,825, filed on Jul. 3, 2014.

(51) Int. Cl.
*C23C 16/44* (2006.01)
*G05D 9/12* (2006.01)
(Continued)

(52) U.S. Cl.
CPC ............ *F17C 6/00* (2013.01); *C23C 16/4481* (2013.01); *F24F 6/025* (2013.01); *G05D 9/02* (2013.01);
(Continued)

(58) Field of Classification Search
CPC .... A61M 16/16; A61M 16/162; A61M 16/00; A61M 16/10; A61M 16/109;
(Continued)

(56) References Cited

U.S. PATENT DOCUMENTS 6,244,576 B1 * 6/2001 Tsai .......................... F24F 6/02
261/141
6,919,539 B2 * 7/2005 Motakef ................. C30B 33/00
117/204
(Continued)

FOREIGN PATENT DOCUMENTS

DE    WO 0197894 A1 * 12/2001    .......... A61M 16/162
FR    WO 9833599 A1 *  8/1998    ......... B05B 17/0615
JP    WO 2014051070 A1 *  4/2014    ............... F04D 1/14

OTHER PUBLICATIONS

International Search Report and Written Opinion dated Sep. 8, 2015 for PCT Application No. PCT/US2015/038296.

*Primary Examiner* — Mary McManmon
*Assistant Examiner* — Hailey K Do
(74) *Attorney, Agent, or Firm* — Moser Taboada; Alan Taboada

(57) ABSTRACT

Methods and apparatus for chemical delivery are provided herein. In some embodiments, a first reservoir holds a first volume of fluid, receives a carrier gas, and outputs the carrier gas together with vapor derived from the first volume of fluid. A second reservoir holds a second volume of fluid and is capable of delivering a part of the second volume of fluid to the first reservoir. A self-regulating tube extends from the first reservoir to a region above the second volume of fluid in the second reservoir.

19 Claims, 7 Drawing Sheets

(51) Int. Cl.
*F24F 6/02* (2006.01)
*F17C 6/00* (2006.01)
*C23C 16/448* (2006.01)
*G05D 9/02* (2006.01)

(52) U.S. Cl.
CPC .......... G05D 9/12 (2013.01); *Y10T 137/6416* (2015.04); *Y10T 137/7306* (2015.04)

(58) Field of Classification Search
CPC .............. A61M 16/164; A61M 16/165; A61M 16/167; A61M 16/168; A61M 16/183; F24F 6/025; F24F 2006/008; C23C 16/4481; G05D 9/12; G05D 9/00; G05D 22/00; G05D 9/02; Y10T 137/6416; Y10T 137/6579; Y10T 137/7303; Y10T 137/86187; Y10T 137/8622; Y10T 137/87595; Y10T 137/87619; Y10T 137/87627

USPC ........ 137/341, 888, 893, 892, 895; 219/406, 219/407; 392/386, 394, 403, 405, 406, 392/458, 459

See application file for complete search history.

(56) References Cited

U.S. PATENT DOCUMENTS

| | | | |
|---|---|---|---|
| 7,186,385 B2* | 3/2007 | Ganguli | C23C 16/18 |
| | | | 392/386 |
| 7,568,495 B2 | 8/2009 | Nakashima et al. | |
| 7,938,112 B2* | 5/2011 | Mayer | A61M 16/0816 |
| | | | 128/203.12 |
| 8,343,281 B2 | 1/2013 | Hong et al. | |
| 8,691,017 B2* | 4/2014 | Ohmi | C23C 14/12 |
| | | | 118/726 |
| 9,155,858 B2* | 10/2015 | Chen | B01F 3/04 |
| 2008/0216743 A1 | 9/2008 | Chen et al. | |
| 2009/0056712 A1* | 3/2009 | Cortez, Jr. | A61M 16/08 |
| | | | 128/203.26 |
| 2009/0114157 A1 | 5/2009 | Lee et al. | |
| 2010/0147299 A1* | 6/2010 | Row | A61M 16/1075 |
| | | | 128/203.27 |
| 2011/0008540 A1 | 1/2011 | Na et al. | |
| 2012/0012186 A1* | 1/2012 | Tantra | A61M 16/16 |
| | | | 137/1 |
| 2012/0088038 A1* | 4/2012 | Prusseit | C23C 14/14 |
| | | | 427/580 |
| 2013/0174843 A1* | 7/2013 | Smith | A61M 16/162 |
| | | | 128/203.26 |
| 2015/0153745 A1* | 6/2015 | Ito | F04D 1/14 |
| | | | 204/241 |

* cited by examiner

APPARATUS AND METHOD FOR SELF-REGULATING FLUID CHEMICAL DELIVERY

CROSS-REFERENCE TO RELATED APPLICATIONS

This application claims benefit of U.S. provisional patent application Ser. No. 62/020,825, filed Jul. 3, 2014, which is herein incorporated by reference in its entirety.

FIELD

Embodiments of the present disclosure generally relate to fluid chemical delivery and, more particularly, to self-regulating fluid chemical delivery.

BACKGROUND

Chemicals used in, for example, semiconductor device processing, are delivered into a process chamber using a fluid containing ampoule. Such known ampoules typically include a canister that is in fluid communication with an inlet port and an outlet port using a carrier gas that is fed through the ampoule. For example, the carrier gas is fed into a space above the fluid, may flow over the fluid, and carries away vapor from the space above the fluid. As another example, the carrier gas is fed into the fluid using a bubbler tube, saturates the fluid, and carries away some of the fluid. The ampoule may be used until all fluid is removed, at which time the ampoule is refilled or replaced. Alternatively, the ampoule may be refilled periodically based on measurements taken using an in situ level sensor. A refill tank holds chemicals for refilling the ampoule and typically has a much larger volume than the ampoule to enable the ampoule to be repeatedly refilled.

Some of the processes used in, for example, semiconductor device processing use one or more chemicals supplied to the process at defined temperature and pressure ranges. For example, a film deposition process may maintain temperature and pressure within predefined ranges to attain a repeatable film quality and consistent film thickness. However, as fluid is consumed in the ampoule, temperature and pressure conditions may change and therefore change the concentration of the chemical being delivered which affects the outcome of the process being carried out.

Accordingly, the inventors have provided improved apparatus and methods for regulating fluid chemical delivery.

SUMMARY

Methods and apparatus for chemical delivery are provided herein. In some embodiments, a chemical delivery apparatus includes: a body having a first reservoir that defines a first volume, the first reservoir including a carrier gas inlet and a carrier gas outlet; a second reservoir disposed in the body above the first reservoir and defining a second volume, the second reservoir having a fill tube fluidly coupling the second reservoir to the first reservoir; and a self-regulating tube extending from the second reservoir to the first reservoir In some embodiments, a chemical delivery apparatus includes: a chemical delivery apparatus includes: a body having a first reservoir that defines a first volume, the first reservoir including a carrier gas inlet and a carrier gas outlet; a second reservoir disposed in the body above the first reservoir and defining a second volume, the second reservoir having a fill tube fluidly coupling the second reservoir to the first reservoir; and a first heater disposed at least along sidewalls of the first reservoir that heats a fluid contained in the first volume based on a first detected temperature of a first fluid contained in the first volume, and a second heater disposed along sidewalls of the second reservoir that heats a fluid contained in the second volume based on a second detected temperature of a second fluid contained in the second volume.

In some embodiments, a chemical delivery apparatus includes: a body having a first reservoir that defines a first volume, the first reservoir including a carrier gas inlet and a carrier gas outlet; and a second reservoir disposed in the body above the first reservoir and defining a second volume, the second reservoir having a fill tube fluidly coupling the second reservoir to the first reservoir; wherein at least one of (a) the first reservoir includes baffles that control a path of cross-flow of the carrier gas or (b) the carrier gas inlet includes a nozzle that controls a path of cross-flow of the carrier gas.

In some embodiments, a chemical delivery method includes: receiving a carrier gas into a first volume that holds a first fluid; collecting, using the carrier gas, vapor that emanates from the first fluid into the first volume; delivering the carrier gas and the vapor from the first volume, and providing a self-regulating tube that extends from the first reservoir to a region above a second fluid contained in the second volume, the second volume being fluidly coupled with the first volume, wherein when the first fluid held in the first volume extends above a lower end of the self-regulating tube, the first fluid seals off the self-regulating tube, and when the first fluid held in the first volume is below a lower end of the self-regulating tube, the carrier gas and the vapor enter the self-regulating tube and cause the second fluid to be delivered from the second volume into the first volume until the first volume of the fluid again extends above the bottom of the self-regulating tube and seals off the self-regulating tube.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
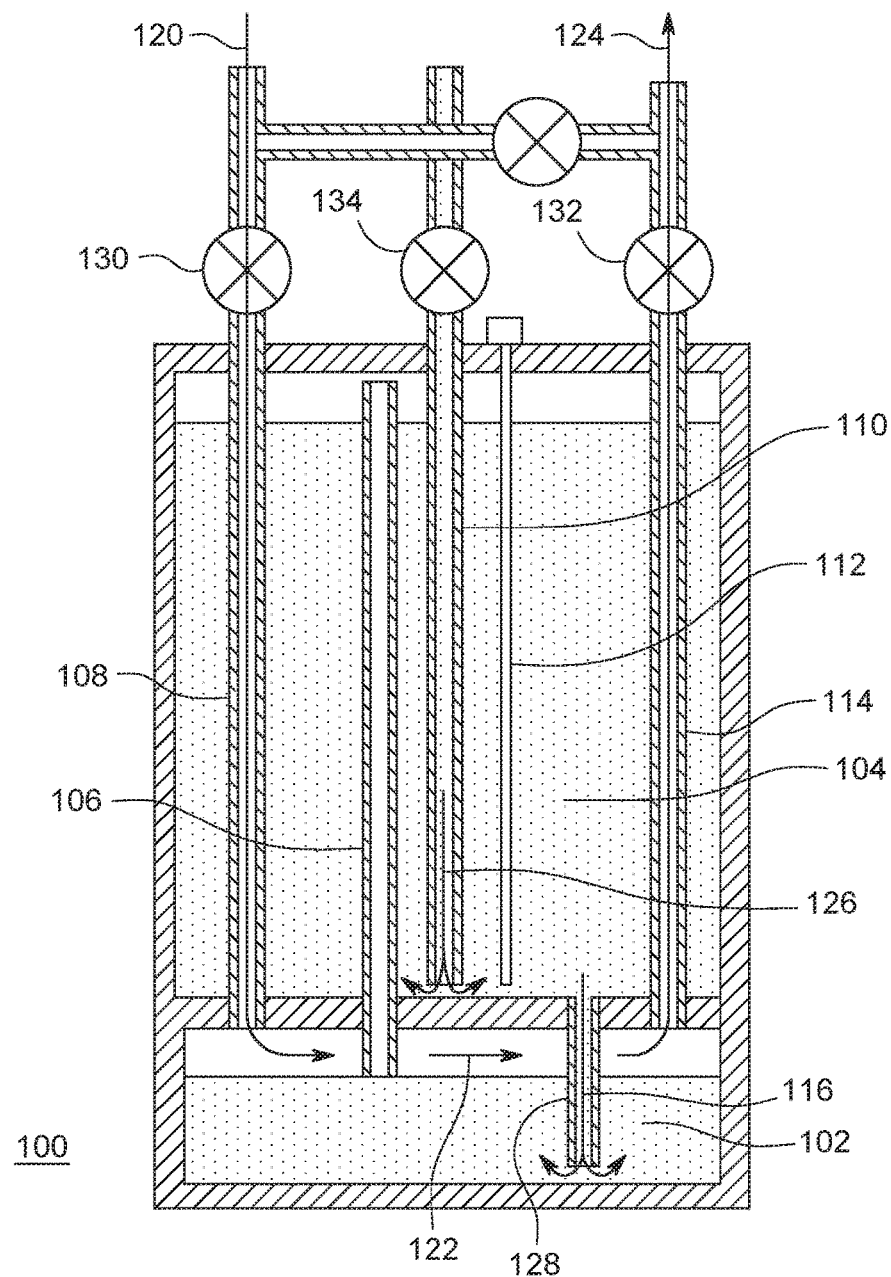
FIG. 1 is a schematic view of an example of a chemical delivery apparatus in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

The present disclosure relates to chemical delivery apparatus and methods in which the level of fluid chemical in an ampoule is advantageously self-regulating. More specifically, the level of fluid in a vapor draw or bubbler functional volume may be self-regulating and the majority of stored fluid may be isolated within a closed volume from the carrier gas. The ampoule may be segregated into two functional volumes, a first volume or lower vapor draw/bubbler volume within a first reservoir, and a second volume or upper refill volume within a second reservoir. The second volume may hold a fluid that is delivered to the first volume. The fluid in the first volume may experience constant flow of carrier gas, whereas the fluid in the second volume may not which may minimize chemical decomposition. The fluid level of the second volume may vary as the chemical is supplied to the first volume.

The second volume may include a refill tube/isolation valve, a level sensor, and a self-regulating tube. The refill tube/isolation valve may be used to add additional fluid into the second volume via, for example, an external bulk delivery system. The refill activity may be determined by a user utilizing either an integrated level sensor or a known consumption rate. The self-regulating tube may be the control mechanism by which the first reservoir may be refilled. As the fluid is consumed in the first reservoir, the bottom of the self-regulating tube may allow the vapor to be displaced above the fluid level of the first volume and may dispense an equivalent amount of fluid to the first reservoir via the refill tube. The above process may be self-regulating and may result in a constant level of fluid in the first reservoir.

A carrier gas may flow into the first volume through the gas inlet tube, and the carrier gas may saturate with vapor and carry the vapor to a process chamber via the gas outlet tube. The first volume can be either in a vapor draw configuration or a bubbler configuration.

In addition to the above, additional features may be included. As an example, one or more vapor spaces may be included and may provide minimum surface contact between the first and second reservoirs which may thermally decouple the two reservoirs. Multi-zone heating of the ampoule may be provided using, for example, two, three or four zone heaters. Adhesiveless bonding of the heaters to the wall of the ampoule may be provided using polyimide heaters.

Fluid level sensing may be included in one or both of the first and second volumes. In-situ fluid temperature measurement for monitoring temperature and/or controlling temperature of a fluid may be provided for one or both of the first and second volumes. The fluid level sensor may be integral with or separate from the fluid temperature measurement sensor.

A nozzle may be provided at an end of the gas inlet tube which may improve uniformity of the carrier gas flow in the first volume and increase fluid concentration. Baffles may be added to the first volume which may improve uniformity of the carrier gas flow in the first volume and increase fluid concentration. For example, five or nine baffles may be provided.

An internal coating may be used on the inner walls and/or bottom of one or both of the first and second reservoirs which may facilitate cleaning of one or both of the reservoirs. The internal coating may be an anti-static friction (anti-stiction) coating. The first and second reservoirs may be separable from each other which may facilitate cleaning of one or both of the reservoirs.

Ampoule pressure may be measured and may be used to control concentration of process precursors in the fluid of one or both of the first and second volumes.

FIG. 1 is a schematic diagram showing an example of an ampoule 100 according to some embodiments of the disclosure. The ampoule is divided into two functional reservoirs. Lower, first reservoir 102 can serve as the vapor draw reservoir or as the bubbler reservoir and defines the first volume which contains the fluid. Upper, second reservoir 104 defines the second volume which contains the fluid and can serve as the refill reservoir and deliver fluid from the second reservoir 104 to the first reservoir 102. For example, the fluid of the first reservoir 102 and the fluid of the second reservoir 104 are of a same fluid. The first reservoir 102 and the second reservoir 104 may be disposed in a common housing or body of the ampoule 100.

When an inlet valve 130 and an outlet valve 132 are open, a carrier gas enters the first reservoir 102 through gas inlet tube 108 along, for example, path 120 into the space above the first fluid and collects vapor which has evaporated from the fluid. The carrier gas carrying the vapor then exits the first reservoir 102 along, for example, path 124 through, for example, gas outlet tube 114 and outlet valve 132. In some embodiments, the carrier gas travels along, for example, cross-flow path 122 and collects vapor along the cross-flow path before exiting along path 124.

A self-regulating tube 106, for example, serves as a control mechanism for controlling refill of the first reservoir 102 (e.g., control of the fluid level in the first reservoir 102). The self-regulating tube 106 extends from above the fluid of the second reservoir 104 in the second reservoir 104 down into the first reservoir 102. Initially, the fluid of the first reservoir 102 extends above the bottom of the self-regulating tube 106 and seals off the self-regulating tube 106. As the fluid of the first reservoir 102 is consumed, the fluid of the first reservoir 102 falls below the bottom of the self-regulating tube 106 so that carrier gas and vapor are permitted to enter the self-regulating tube 106 and travel up to the second reservoir 104. The carrier gas and vapor that enter into the second reservoir 104 from the self-regulating tube 106 push on the fluid of the second reservoir 104 and cause fluid to be delivered to the first reservoir 102 along, for example, path 128 through a fill tube 116. The fill tube 116 extends from, for example, the bottom of the second reservoir to, for example, below the level of the fluid in the first reservoir (e.g., in some embodiments, proximate a bottom of the first reservoir 102). The fluid continues to be delivered to the first reservoir 102 until the fluid of the first reservoir 102 again extends above the bottom of the self-regulating tube 106 and seals off the self-regulating tube 106. In this manner, the volume of fluid in the first reservoir 102 is controlled.

In an example of the second reservoir 104, the second reservoir 104 does not refill so that the fluid of the second reservoir 104 decreases as fluid is transferred from the first reservoir 102 to the second reservoir 104. In some embodiments, a chemical level sensor 112 may be provided to detect the level of fluid of the second reservoir 104 and determine, for example, whether the second reservoir 104 is empty, near empty, or at some other desired level. In some embodiments, the detected fluid level is used to control a fluid input valve 134 to deliver fluid along bulk refill inlet tube 110 into the second reservoir 104 along, for example, path 126 to maintain a constant fluid level in the second reservoir 104. In some embodiments, the level of fluid of the second reservoir 104 is determined using known chemical consumption rates and determines when to operate the fluid input valve 134.

Figure 2:
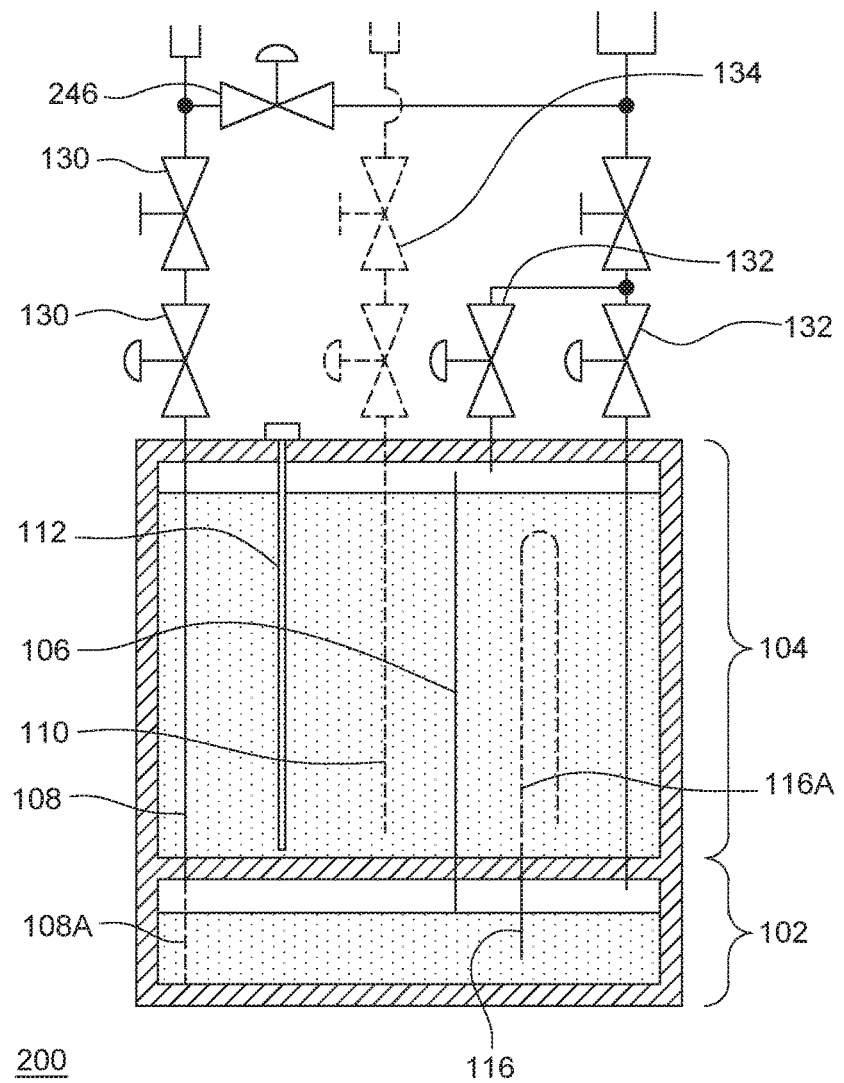
FIG. 2 is a schematic view of another example of a chemical delivery apparatus in accordance with some embodiments of the present disclosure.

FIG. 2 is a schematic diagram showing an example of an ampoule 200 according to some embodiments of the disclosure. In the example, like reference numerals provide a like function as described in FIG. 1. FIG. 2 shows the bulk refill inlet tube 110 and the fluid input valve 134 as broken lines to indicate that the refill feature of the second reservoir is an alternative feature. Additionally, as a further alternative, in a bubbler configuration, the gas inlet tube 108 extends (as depicted by dashed line 108a) to below the level of the fluid of the first reservoir 102 so that the carrier gas passes through the fluid of the first reservoir 102 (e.g., bubbles through the fluid of the first reservoir 102). As another alternative, the fill tube 116 may be configured as a fluid driven configuration (as depicted by solid line) or as a siphon (as depicted by dashed line 116a).

Figure 3:
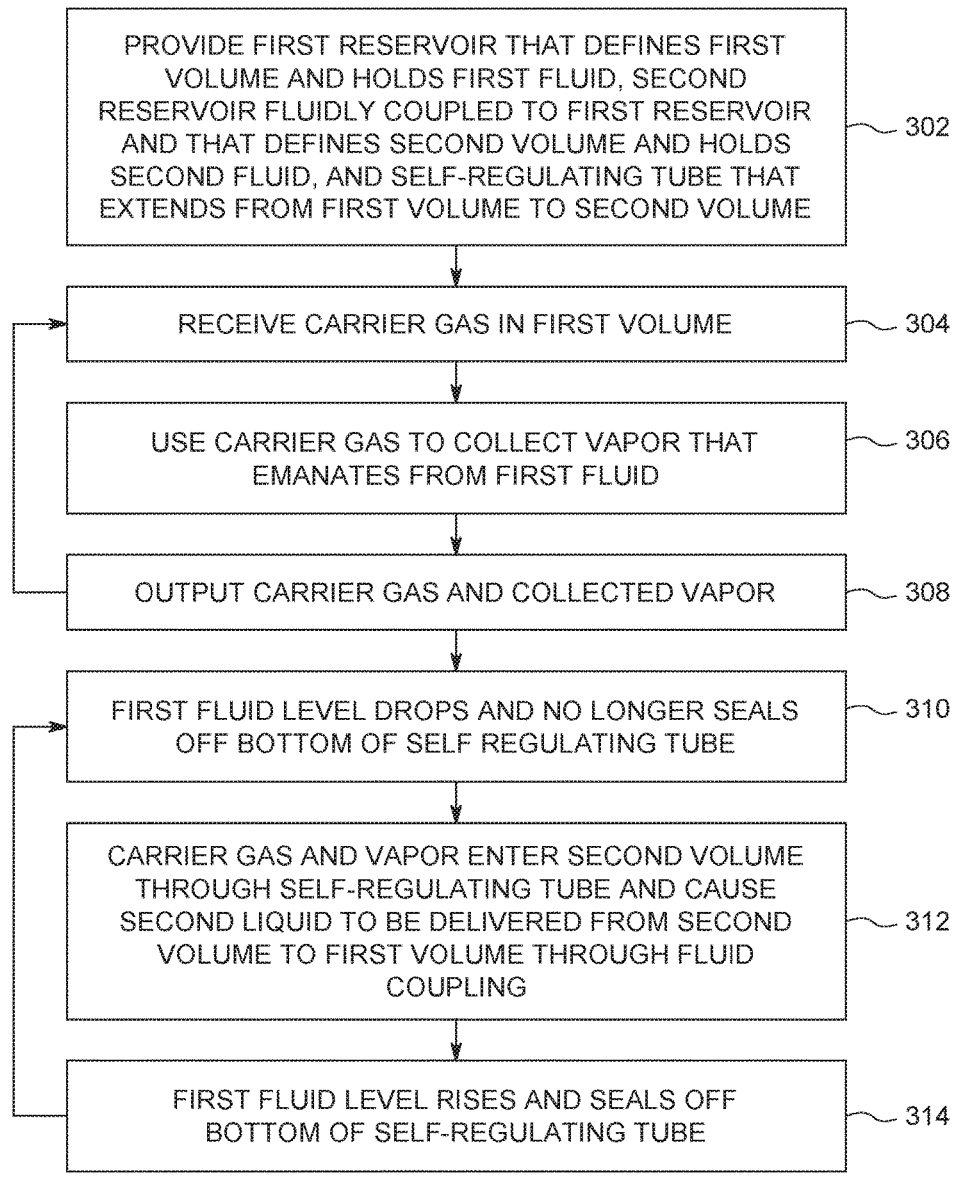
FIG. 3 is a flow chart showing an example of a chemical delivery method carried out in accordance with some embodiments of the present disclosure.

FIG. 3 is a flow diagram showing an example of a method according to some embodiments of the disclosure. At 302, the first and second reservoirs and the self-regulating tube are provided. At 304, carrier gas is received in the first reservoir 102, and at 306, the carrier gas is used to collect vapor. At 306, the carrier gas and vapor are outputted. 304, 306, and 308 may be carried out repeatedly.

At 310, the fluid level drops and no longer seals off the bottom of the self-regulating tube. At 312, the carrier gas and vapor enter the second reservoir 104 through the self-regulating tube and cause the liquid to be delivered from the second reservoir 104 to the first reservoir 102 through a fluid coupling. At 314, the fluid level rises and seals off the bottom of the self-regulating tube. 310, 312, and 314 may be carried out repeatedly.

Figure 4A:
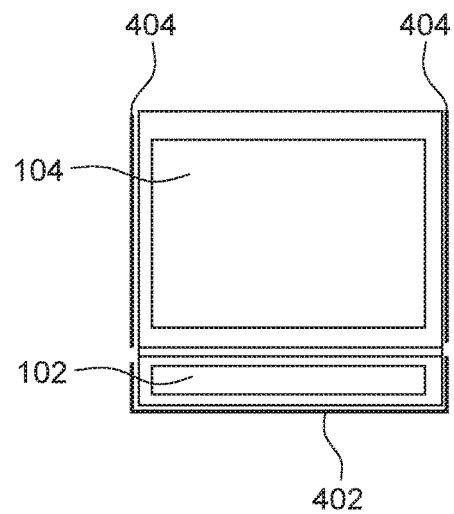
FIGS. 4A-4C are side views of further examples of a chemical delivery apparatus in accordance with some embodiments of the present disclosure.
Figure 4B:
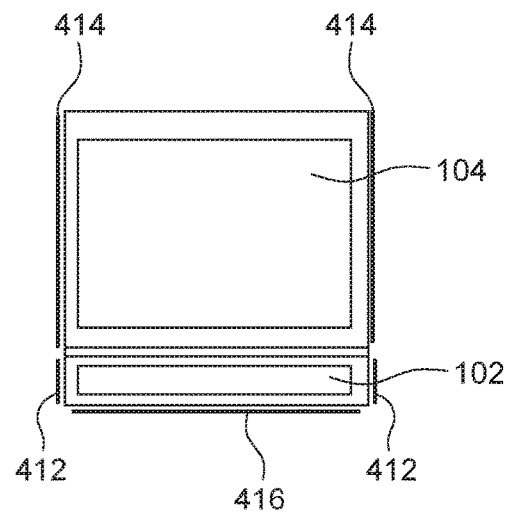
Figure 4C:
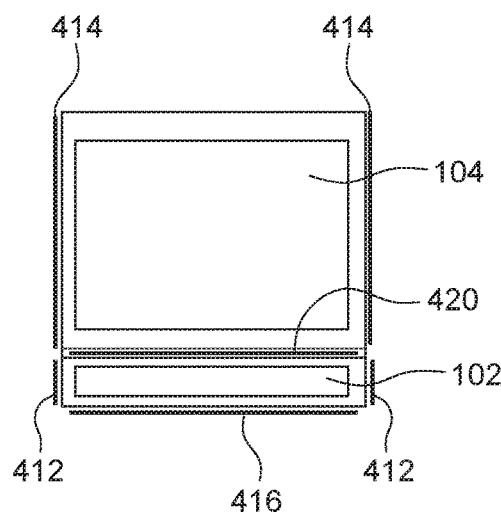

FIG. 4A-4C show examples of heater arrangements in accordance with the disclosure. FIG. 4A shows an example in which two heaters may be provided. A first heater 402 surrounds the walls and bottom of the first reservoir 102 and a second heater 404 surrounds the walls of the second reservoir 104. FIG. 4B shows an example in which three heaters may be provided. A first heater 412 surrounds the walls of the first reservoir 102, a second heater 414 surrounds the walls of the second reservoir 104, and a third heater 416 is disposed at the bottom of the first reservoir 102. FIG. 4C shows an example in which four heaters may be provided. The first heater 412, second heater 414, and a third heater 416 correspond to the heaters of like number in FIG. 4B. A further or fourth heater 420 is located between the top of the first reservoir 102 and the bottom of the second reservoir 104.

FIGS. 5A-5D show examples of baffles incorporated in the first reservoir 102 in accordance with the disclosure.

Figures 5A, 5C:
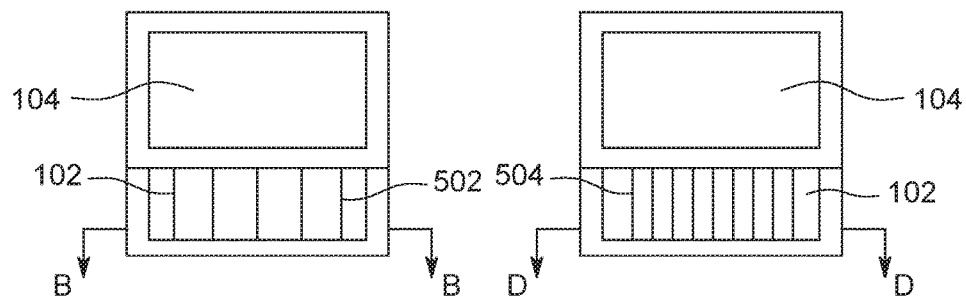
FIGS. 5A, 5C and 5E are side views of still further examples of a chemical delivery apparatus in accordance with some embodiments of the present disclosure.
Figures 5B, 5D:
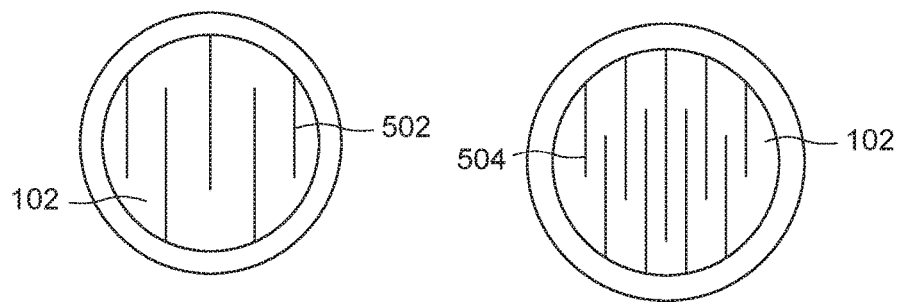
FIGS. 5B and 5D are cross-sectional views of the examples shown in FIGS. 5A and 5C, respectively.
Figure 5E:
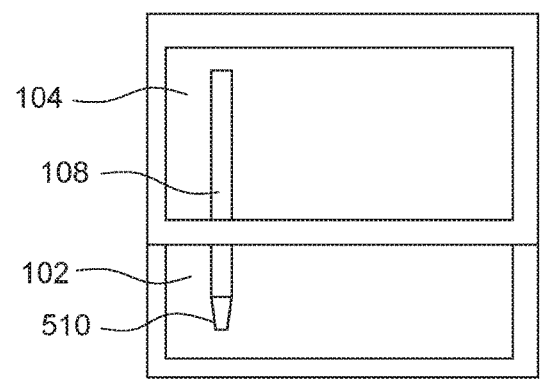

FIG. 5A shows a side view of an example in which five baffles 502 may be present in the first reservoir 102. FIG. 5B shows a cross sectional top view of the five baffles 502 which is taken along line B-B of FIG. 5A. FIG. 5C depicts a side view of an example in which nine baffles 504 may be included in the first reservoir 102. FIG. 5D is a cross sectional top view of the nine baffles 504 which is taken along line D-D of FIG. 5B. FIG. 5E shows a side view of an example in which a nozzle 510 may be included at an end of the gas inlet tube 108 (also shown in FIGS. 1 and 2) either alternatively to, or in combination with, the baffles 502 or 504.

Figure 6A:
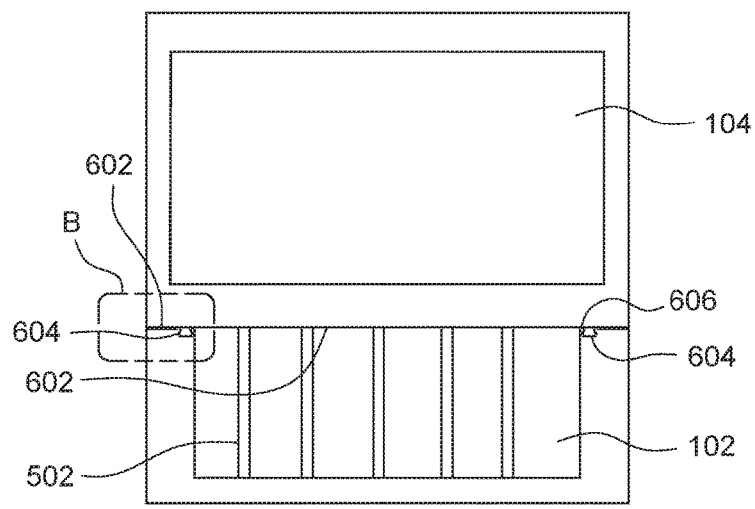
FIG. 6A is a side view of yet another example of a chemical delivery apparatus in accordance with some embodiments of the present disclosure.
Figure 6B:
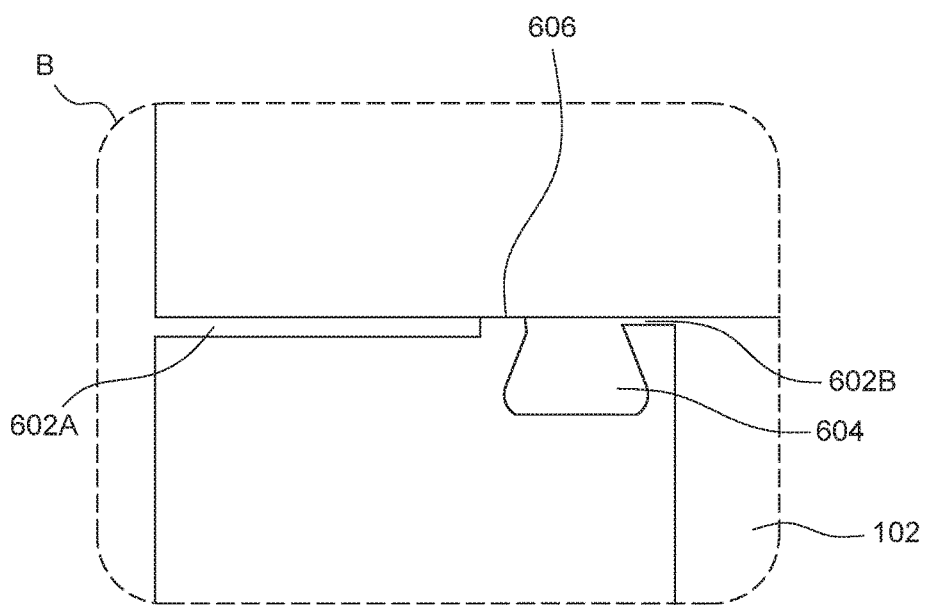
FIG. 6B is an enlarged view of a portion of the example shown in FIG. 6A.

FIGS. 6A-6B show examples of thermal barriers disposed between the first and second reservoirs in accordance with some embodiments of the present disclosure. FIG. 6A shows gaps 602 which may be located between the top wall of the first reservoir 102 and the bottom wall of the second reservoir 104. FIG. 6A also shows an additional thermal barrier space 604 which may be included between the first reservoir 102 and the second reservoir 104. FIG. 6B shows a region B of FIG. 6A in greater detail.

Figure 7A:
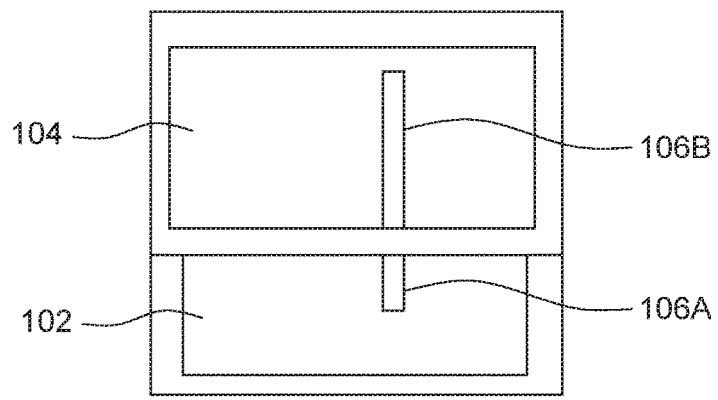
FIGS. 7A and 7B are side views of still another example of a chemical delivery apparatus in accordance with some embodiments of the present disclosure.
Figure 7B:
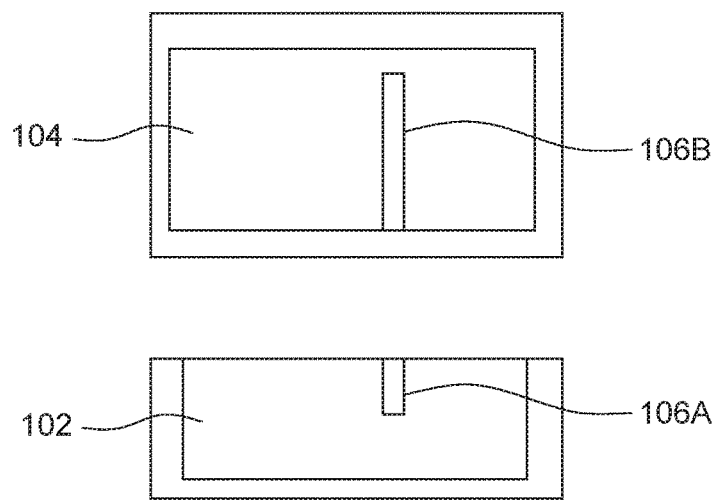

FIGS. 7A and 7B show an example in which the first reservoir 102 and the second reservoir 104 may be divisible into separate assemblies in accordance with some embodiments of the present disclosure. FIG. 7A shows the two reservoirs coupled together and may be sealed, such as using an O-ring. FIG. 7B shows which the first reservoir 102 and the second reservoir 104 separated. FIGS. 7A and 7B also show that the self-regulating tube 106 may be separable into a first part 106A which may be part of the first reservoir 102 and a second part 106B which may be part of the second reservoir 104.

While the foregoing is directed to embodiments of the present disclosure, other and further embodiments of the disclosure may be devised without departing from the basic scope thereof.

The invention claimed is:

1. A chemical delivery apparatus, comprising:
   a body having a first reservoir that defines a first volume, the first reservoir including a carrier gas inlet and a carrier gas outlet;
   a second reservoir disposed in the body above the first reservoir and defining a second volume, the second reservoir having a fill tube fluidly coupling the second reservoir to the first reservoir;
   an annular gap disposed between a top wall of the first reservoir and a bottom wall of the second reservoir, wherein the annular gap forms a thermal barrier between sidewalls of the first reservoir and the second reservoir, wherein the annular gap defines a void between the sidewalls of the first reservoir and the second reservoir;
   a gas inlet tube to deliver a carrier gas to the first reservoir, the gas inlet tube disposed through a top of the body and extending through the second reservoir, wherein an end of the gas inlet tube defines the carrier gas inlet;
   a gas outlet tube to carry vapors out of the first reservoir, disposed through a top of the body and extending through the second reservoir, wherein an end of the gas outlet tube defines the carrier gas outlet; and
   a self-regulating tube extending from the second reservoir to the first reservoir, wherein the lower end of the self-regulating tube is disposed above the lower end of the fill tube.

2. The chemical delivery apparatus of claim 1, further comprising a fluid level sensor that detects a level of a fluid contained in at least one of the first volume or the second volume.

3. The chemical delivery apparatus of claim 1, further comprising a bulk refill inlet tube connected to the second volume, and a fluid input valve that controls opening of the bulk refill inlet tube based on a detected level of a fluid contained in at least one of the first volume or the second volume.

4. The chemical delivery apparatus of claim 1, further comprising a temperature sensor that detects a temperature of a fluid contained in at least one of the first volume or the second volume.

5. The chemical delivery apparatus of claim 1, wherein the second reservoir is a closed volume reservoir.

6. The chemical delivery apparatus of claim 1, wherein the first reservoir and the second reservoir are removably coupled to each other.

7. The chemical delivery apparatus of claim 1, further comprising an anti-static friction (anti-stiction) coating is disposed on at least one of an inner wall or a bottom of at least one of the first reservoir or the second reservoir.

8. The chemical delivery apparatus of claim 1, wherein the first reservoir includes baffles that control a path of cross-flow of the carrier gas.

9. The chemical delivery apparatus of claim 1, wherein the carrier gas inlet includes a nozzle that controls a path of cross-flow of the carrier gas.

10. The chemical delivery apparatus of claim 1, wherein at least one of:
(a) the lower end of the fill tube is disposed proximate the bottom of the first reservoir; or
(b) the upper end of the self-regulating tube is disposed proximate the top of the second reservoir.

11. A chemical delivery apparatus, comprising:
a body having a first reservoir that defines a first volume, the first reservoir including a carrier gas inlet and a carrier gas outlet;
a second reservoir disposed in the body above the first reservoir and defining a second volume, the second reservoir having a fill tube fluidly coupling the second reservoir to the first reservoir, wherein the lower end of the fill tube is disposed proximate the bottom of the first reservoir;
a gas inlet tube to deliver a carrier gas to the first reservoir, the gas inlet tube disposed through a top of the body and extending through the second reservoir, wherein an end of the gas inlet tube defines the carrier gas inlet;
a gas outlet tube to carry vapors out of the first reservoir, disposed through a top of the body and extending through the second reservoir, wherein an end of the gas outlet tube defines the carrier gas outlet;
a first heater disposed at least along sidewalls of the first reservoir that heats a fluid contained in the first volume based on a first detected temperature of a first fluid contained in the first volume, and a second heater disposed along sidewalls of the second reservoir that heats a fluid contained in the second volume based on a second detected temperature of a second fluid contained in the second volume; and a thermal barrier disposed between adjacent sidewalls of the first reservoir and the second reservoir, wherein the thermal barrier includes a void between the adjacent sidewalls of the first reservoir and the second reservoir.

12. The chemical delivery apparatus of claim 1, further comprising a first heater disposed along sidewalls of the first reservoir, and a second heater disposed along sidewalls of the second reservoir.

13. The chemical delivery apparatus of claim 12, wherein the first heater is further disposed along a bottom of the first reservoir.

14. The chemical delivery apparatus of claim 12, further comprising a third heater disposed along a bottom of the first reservoir.

15. The chemical delivery apparatus of claim 12, further comprising a further heater separate from the first and second heaters and disposed between a bottom of the second reservoir and a top of the first reservoir.

16. The chemical delivery apparatus of claim 11, wherein the first heater is further disposed along a bottom of the first reservoir.

17. The chemical delivery apparatus of claim 11, further comprising a third heater disposed along the bottom of the first reservoir.

18. The chemical delivery apparatus of claim 11, further comprising a third heater disposed between a bottom of the second reservoir and a top of the first reservoir.

19. A chemical delivery apparatus, comprising:
a body having a first reservoir that defines a first volume, the first reservoir including a carrier gas inlet and a carrier gas outlet;
a second reservoir disposed in the body above the first reservoir and defining a second volume, the second reservoir having a fill tube fluidly coupling the second reservoir to the first reservoir, wherein the lower end of the fill tube is disposed proximate the bottom of the first reservoir;
a gas inlet tube to deliver a carrier gas to the first reservoir, the gas inlet tube disposed through a top of the body and extending through the second reservoir, wherein an end of the gas inlet tube defines the carrier gas inlet;
a self-regulating tube extending from the second reservoir to the first reservoir, wherein the upper end of the self-regulating tube is disposed proximate the top of the second reservoir, wherein the self-regulating tube is separable into a first part disposed in the first reservoir and a second part disposed in the second reservoir, wherein the first part extends into the first reservoir away from the second reservoir, and wherein the second part extends into the second reservoir away from the first reservoir; and
a gas outlet tube to carry vapors out of the first reservoir, disposed through a top of the body and extending through the second reservoir, wherein an end of the gas outlet tube defines the carrier gas outlet,
wherein at least one of (a) the first reservoir includes baffles that control a path of cross-flow of the carrier gas or (b) the carrier gas inlet includes a nozzle that controls a path of cross-flow of the carrier gas.

* * * * *